United States Patent
Moon

(10) Patent No.: US 7,187,235 B2
(45) Date of Patent: Mar. 6, 2007

(54) CLASS AB RAIL-TO-RAIL OPERATIONAL AMPLIFIER

(75) Inventor: Kyeong-Tae Moon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 10/946,222

(22) Filed: Sep. 21, 2004

(65) Prior Publication Data

US 2005/0077961 A1    Apr. 14, 2005

(30) Foreign Application Priority Data

Oct. 13, 2003    (KR) ...................... 10-2003-0070964

(51) Int. Cl.
*H03F 3/45*    (2006.01)
(52) U.S. Cl. ...................... 330/255; 330/257
(58) Field of Classification Search ................ 330/255, 330/257
See application file for complete search history.

(56) References Cited

U.S. PATENT DOCUMENTS 5,311,145 A * 5/1994 Huijsing et al. ............ 330/255
5,734,297 A * 3/1998 Huijsing et al. ............ 330/253
6,150,883 A   11/2000 Ivanov ........................ 330/253
6,188,269 B1   2/2001 Hauser ........................ 327/540
6,657,495 B2 * 12/2003 Ivanov et al. ................ 330/255
2005/0040889 A1 * 2/2005 Tsuchi ........................ 330/255

FOREIGN PATENT DOCUMENTS

KR    94-23027    10/1994
KR    01-39335    5/2001

* cited by examiner

*Primary Examiner*—Khanh Van Nguyen
(74) *Attorney, Agent, or Firm*—Mills & Onello LLP

(57) ABSTRACT

The static bias current of the output stage circuit of the class AB rail-to-rail operational amplifier is controlled by the external bias control signals. The class AB rail-to-rail operational amplifier receives the external bias control signals and controls the bias voltage of the output stage circuit, and thus the static bias current of the output stage circuit may be controlled. The class AB rail-to-rail operational amplifier may further include a frequency compensation circuit for compensating high frequency characteristics of the operational amplifier.

14 Claims, 6 Drawing Sheets

CLASS AB RAIL-TO-RAIL OPERATIONAL AMPLIFIER

CROSS-REFERENCE TO RELATED APPLICATIONS

This application relies for priority upon Korean Patent Application No. 2003-70964 filed on Oct. 13, 2003, the contents of which are herein incorporated by reference in their entirety.

BACKGROUND OF THE INVENTION

1. Field of the Invention

The present invention relates to an AB class rail-to-rail operational amplifier.

2. Description of the Related Art

An operational amplifier has a finite voltage gain, finite input impedance and an output impedance larger than zero.

In general, the operational amplifier is required to have a high voltage gain and to maintain the high voltage gain over a high frequency. In general, the voltage gain of the operational amplifier decreases as the frequency increases.

The operational amplifier is also required to have a high input impedance and a low output impedance.

A complimentary metal oxide semiconductor (CMOS) operational amplifier having a rail-to-rail input stage and a rail-to-rail output stage is disclosed in U.S. Pat. No. 5,311,145. According to the CMOS operational amplifier of U.S. Pat. No. 5,311,145, a floating current source is connected to a summing circuit to provide current to the summing circuit, and a bias current is provided to output transistors of a class AB output stage.

According to the CMOS operational amplifier of U.S. Pat. No. 5,311,145, the area of the operational amplifier may increase because the floating current source has a plurality of transistors. In addition, the plurality of transistors is disposed along a signal path. According to frequency domain characteristics of the voltage gain, the voltage gain has a plurality of poles due to the transistors and wirings disposed adjacent to the signal path, so that the frequency characteristics of the operational amplifier may be degraded.

According to the CMOS operational amplifier of U.S. Pat. No. 5,311,145, two bias transistors $Q_{D1}$ and $Q_{D2}$ are coupled to each other in parallel, an output voltage of a diode-coupled circuit is applied to a gate electrode of each of bias control transistors. The CMOS operational amplifier of U.S. Pat. No. 5,311,145 may not be controlled by an external control signal, and a gate voltage of the output stage varies in accordance with various parameters that are determined in a manufacturing process of the operational amplifier, and thus static bias current of the output stage may depend on the manufacturing process of the operational amplifier.

Accordingly, the frequency characteristics and phase characteristics of the operational amplifier may be degraded due to the transistors and the wirings disposed adjacent to the signal path.

SUMMARY OF THE INVENTION

Accordingly, the present invention is provided to substantially obviate one or more problems due to limitations and disadvantages of the related art.

The present invention provides a class AB rail-to-rail operational amplifier capable of controlling a static bias current of an output stage circuit of the operational amplifier using external control signals.

The present invention also provides a class AB rail-to-rail operational amplifier capable of preventing degradation of a phase characteristic of the operational amplifier due to transistors and wirings disposed adjacent to the signal path.

In accordance with one aspect of the invention, a rail-to-rail operational amplifier includes a differential input stage circuit, a current summing circuit, an output stage circuit, and a bias control circuit. The differential input stage circuit includes a first differential amplifier and a second differential amplifier. The first differential amplifier is coupled to a negative supply rail voltage via a first current source, and the second differential amplifier is coupled to a positive supply rail voltage via a second current source. The current summing circuit includes a current mirror circuit, a third current source and a fourth current source. The current summing circuit is coupled between the positive and negative supply rail voltages and receives an output signal of the differential input stage circuit. The output stage circuit is coupled to output terminals of the current summing circuit to output a differential amplified signal. The output stage circuit is coupled between the positive and negative supply rail voltages. The bias control circuit is coupled to the output terminals of the current summing circuit and is coupled between the current mirror circuit and the first current source. The bias control circuit receives at least one bias control signal to control a bias voltage of input terminals of the output stage circuit, and to control a bias current of the output stage circuit.

For example, the rail-to-rail operational amplifier further includes a frequency compensation circuit. The frequency compensation circuit is configured to compensate a frequency characteristic of an output signal of the output stage circuit. The frequency compensation circuit may be coupled between an output terminal of the differential input stage circuit and an output terminal of the output stage circuit. The frequency compensation circuit may include a first capacitor and a second capacitor.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DESCRIPTION OF EMBODIMENTS

<Embodiment 1>

Figure 1:
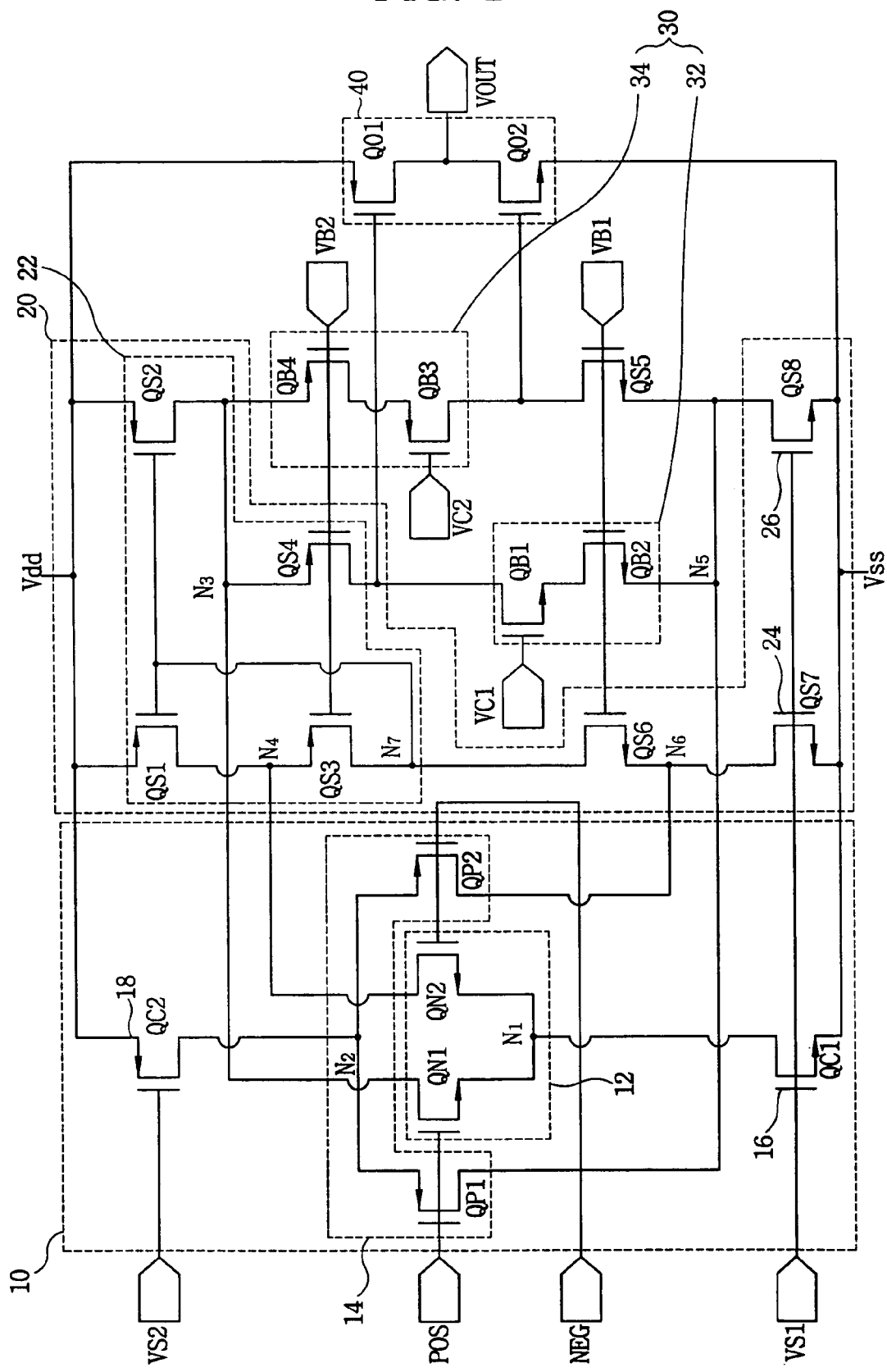
FIG. 1 is a circuit diagram showing a class AB rail-to-rail operational amplifier according to one exemplary embodiment of the present invention.

FIG. 1 is a circuit diagram showing a class AB rail-to-rail operational amplifier according to one exemplary embodiment of the present invention.

Referring to FIG. 1, the class AB rail-to-rail operational amplifier includes a differential input stage circuit 10, a current summing circuit 20, a bias control circuit 30, and an output stage circuit 40.

The differential input stage circuit 10 includes first and second differential amplifiers 12 and 14 and first and second current sources 16 and 18.

The first differential amplifier 12 includes NMOS transistors QN1 and QN2. The NMOS transistors QN1 and QN2 may be a matched transistor pair. The NMOS transistors QN1 and QN2 have common source configuration. Source electrodes of each of the transistors QN1 and QN2 are connected to a common node N1, and a first current source 16 is connected between the common node N1 and a negative supply rail voltage Vss. The first current source 16 includes an NMOS transistor QC1, and sinks a bias current of the first differential amplifier 12 so that substantially constant bias current is provided to the transistors QN1 and QN2. A bias control voltage VS1 input to a gate electrode of the transistor QC1 controls the quantity of the bias current provided to the first differential amplifier 12.

The second differential amplifier 14 includes PMOS transistors QP1 and QP2. The PMOS transistors QP1 and QP2 may be a matched transistor pair. The PMOS transistors QP1 and QP2 have common source configuration. Source electrodes of each of the transistors QP1 and QP2 are connected to a common node N2, and a second current source 18 is connected between the common node N2 and a positive supply rail voltage Vdd. The second current source 18 includes a PMOS transistor QC2, and sinks a bias current of the second differential amplifier 14 so that substantially constant bias current is provided to the transistors QP1 and QP2. A bias control voltage VS2 input to a gate electrode of the transistor QC2 controls the quantity of the bias current provided to the second differential amplifier 14.

For example, the bias current provided to the first differential amplifier 12 is substantially the same value as the bias current provided to the second differential amplifier 14. That is, the bias control voltages VS1 and VS2 may be controlled such that the bias current provided to the first differential amplifier 12 is substantially the same value as the bias current provided to the second differential amplifier 14.

Gate electrodes of the transistors QP1 and QN1 are commonly connected to a positive input terminal POS, and gate electrodes of the transistors QP2 and QN2 are commonly connected to a negative input terminal NEG.

Drain electrodes of the transistors QN1 and QN2 are output terminals (nodes N3, N4) of the first differential amplifier 12. Specifically, the drain electrode of the QN1 is an output terminal (node N3) of the first differential amplifier 12 in a small signal operation mode. Drain electrodes of the transistors QP1 and QP2 are output terminals (nodes N5, N6) of the second differential amplifier 14. Specifically, the drain electrode of the QP1 is an output terminal (node N5) of the second differential amplifier 14 in a small signal operation mode.

The operational amplifier performs a rail-to-rail operation at the differential input stage circuit 10. An input common mode voltage at the differential input stage circuit 10 varies throughout the range between the positive supply rail voltage Vdd and the negative supply rail voltage Vss.

The current summing circuit 20 includes a current mirror circuit 22 and at least one current source. The current mirror circuit 22 is connected between the positive supply rail voltage Vdd and the negative supply rail voltage Vss. The at least one current source is connected between the bias control circuit 30 and the negative supply rail voltage Vss.

The current mirror circuit 22 includes transistors QS1, QS2, QS3, QS4, QS5, and QS6. For example, the transistors QS1 through QS4 are PMOS transistors. A first common gate amplifier includes the transistor QS3 and QS4, and a second common gate amplifier includes the transistor QS5 and QS6. A gate electrode of the transistor QS1 is commonly connected to a gate electrode of the transistor QS2 and is connected to a drain electrode of the transistor QS3. In addition, source electrodes of the transistors QS1 and QS2 are connected to positive supply rail voltage Vdd. A drain electrode of the transistor QS1 is connected to a drain electrode of the transistor QN2 of the first differential amplifier 12, and is connected to a source electrode of the transistor QS3.

A gate electrode of transistor QS2 is connected to a drain electrode of the transistor QS3. A drain electrode of the transistor QS2 is connected to a drain electrode of the transistor QN1, a source electrode of the transistor QS4 and a source electrode of the transistor QB4.

Gate electrodes of the transistors QS3 and QS4 are commonly connected to each other, are commonly connected to a gate electrode of the transistor QB4 of the bias control circuit 30, and receive a second bias voltage VB2.

A source electrode of the transistor QS3 is connected to a drain electrode of the transistor QS1 and a drain electrode of the transistor QN2. A drain electrode of the transistor QS3 is connected to gate electrodes of the transistors QS1 and QS2, and is connected to a drain electrode of the transistor QS6. The transistors QS1 and QS3 form a negative feedback circuit that controls a small signal amplified by the transistor QN2 of the first differential amplifier 12.

A drain electrode of the transistor QS4 is connected to a drain electrode of the transistor QB1 of the bias control circuit 30 and a gate electrode of the transistor QO1 of the output stage circuit 40. The transistor QS4 is folded cascode-connected to the transistor QN1 of the first differential amplifier 12, and thereby forming a main signal path in a small signal operation mode.

The current summing circuit 20 includes at least one current source, for example two current sources 24 and 26.

The third current source 24 includes a transistor QS7. A gate electrode of the transistor QS7 receives the bias control voltage VS1. A source electrode of the transistor QS7 is connected to the negative supply rail voltage Vss, and a drain electrode of the transistor QS7 is connected to a source electrode of the transistor QS6 and a drain electrode of the transistor QP2 of the second differential amplifier 14.

The fourth current source 26 includes a transistor QS8. A gate electrode of the transistor QS8 is commonly connected to gate electrodes of the transistors QC1 and QS7, and receives the bias control voltage VS1. A source electrode of the transistor QS8 is connected to the negative supply rail voltage Vss, and a drain electrode of the transistor QS8 is connected to a source electrode of the transistor QS5, a drain electrode of the transistor QP1 of the second differential amplifier 14 and a source electrode of the transistor QB2 of the bias control circuit 30.

A gate electrode of the transistor QS6 is commonly connected to gate electrodes of the transistors QB2 and QS5. The gate electrode of the transistor QS6 receives a first bias voltage VB1.

A signal path comprised of the transistors QS3 and QS6 sums currents. When a voltage small signal is applied to the NEG terminal, a small signal generated by the transistor QN2 flows into the transistor QS3, and a small signal generated by the transistor QP2 flows into the transistor QS6. Thus, the small signals are added to each other at the signal path comprised of the transistors QS3 and QS6 sums. When the transconductance (gm) and the small signal output resistance (ro) of the transistor QN2 is the same as those of the transistor QP2 and the transconductance (gm) and the small signal output resistance (ro) of the transistor QS3 is the same as those of the transistor QS6, the summed small signals is zero at the drain of the transistors QS3 and QS6.

A drain electrode of the transistor QS5 is connected to a drain electrode of the transistor QB3 of the bias control circuit 30 and a gate electrode of the transistor QO2 of the output stage circuit 40. The transistor QS5 is folded cascode-connected to the transistor QP1 of the second differential amplifier 14, and thereby forming a main signal path in a small signal operation mode.

The bias control circuit 30 includes a first bias control circuit 32 and a second bias control circuit 34. The first bias control circuit 32 is connected between the transistors QS4 and QS8. The second bias control circuit 34 is connected between the transistors QS2 and QS5.

The first bias control circuit 32 includes bias control transistors QB1 and QB2. A gate electrode of the bias control transistor QB1 receives the first control voltage VC1, and a source electrode of the bias control transistor QB1 is connected to a drain electrode of the transistor QB2.

A gate electrode of the bias control transistor QB2 receives the first bias voltage VB1.

A gate bias voltage of the transistor QO1 has a voltage level predetermined by the signal path comprised of transistors QS4, QB1 and QB2. A gate bias voltage of the transistor QO1 is controlled by the second bias voltage VB2 and the first control voltage VC1.

The second bias control circuit 34 includes bias control transistors QB3 and QB4. A gate electrode of the bias control transistor QB3 receives the second control voltage VC2, and a source electrode of the bias control transistor QB3 is connected to a drain electrode of the transistor QB4.

A gate electrode of the bias control transistor QB4 receives the second bias voltage VB2.

A gate bias voltage of the transistor QO2 has a voltage level predetermined by the signal path comprised of transistors QS5, QB3 and QB4. A gate bias voltage of the transistor QO2 is controlled by the first bias voltage VB1 and the second control voltage VC2.

The output stage circuit 40 includes transistors QO1 and QO2.

A source electrode of the transistor QO1 is connected to the positive supply rail voltage Vdd, and a drain electrode of the transistor QO1 is connected to a drain electrode of the transistor QO2 and the output terminal VOUT of the operational amplifier. A gate electrode of the transistor QO1 is connected to a drain electrode of the transistor QS4 of the current summing circuit 20 and a drain electrode of the transistor QB1 of the first bias control circuit 32.

A source electrode of the transistor QO2 is connected to the negative supply rail voltage Vss, and a drain electrode of the transistor QO2 is connected to a drain electrode of the transistor QO1 and the output terminal VOUT of the operational amplifier.

The transistors QO1 and QO2 have a common source configuration. The bias current of the transistors QO1 and QO2 is determined by the bias voltage applied to the gate electrodes of the transistors QO1 and QO2. Thus, the operational amplifier functions as a class AB rail-to-rail operational amplifier.

Hereinafter, the operation of the class AB rail-to-rail operational amplifier according to one exemplary embodiment of the present invention is described.

Referring to FIG. 1, the transistors QN1 and QN2 of the first differential amplifier 12 are differential pair, and the transistors QP1 and QP2 of the second differential amplifier 14 are differential pair.

For example, the first differential amplifier 12 is comprised of NMOS transistors, and the second differential amplifier 14 is comprised of PMOS transistors. The threshold voltages of the transistors QN1 and QN2 may be the same when the NMOS transistors QN1 and QN2 are a matched transistor pair. The threshold voltages of the transistors QP1 and QP2 may be the same when the PMOS transistors QP1 and QP2 are a matched transistor pair.

Hereinafter, it is assumed that the transistors of the differential input stage circuit 10 operate in a saturation region, and the body effect of the transistors is disregarded.

First, the input voltage range of the first differential amplifier 12 is between Vmin1 and Vmax1. Vmin1 is a minimum value of the input voltage of the first differential amplifier 12 and Vmax1 is a maximum value of the input voltage of the first differential amplifier 12.

$$Vmin1 = Vss + \Delta c1 + Vgsn \qquad \text{<Expression 1>},$$

wherein Vss represents the negative supply rail voltage, $\Delta c1$ represents drain-source voltage in a saturation mode (|Vds,sat|) of transistor QC1, and Vgsn represents a gate-source voltage of transistors QN1 and QN2.

Since Vgsn=$\Delta$n+Vtn (Vtn represents a threshold voltage of transistors QN1 and QN2, $\Delta$n represents |Vds,sat| of transistors QN1 and QN2), the expression 2 is obtained.

$$Vmin1 = Vss + \Delta c1 + \Delta n + Vtn \qquad \text{<Expression 2>}$$

$$Vmax1 = Vdd - \Delta s1 + Vgdn \qquad \text{<Expression 3>},$$

wherein Vdd represents the positive supply rail voltage, $\Delta s1$ represents |Vds,sat| of transistors QS1 and QS2. Since the transistors QS1 and QS2 are matched to each other and form a current mirror. Thus, |Vds,sat| of the transistors QS1 and QS2 are the same. Vgdn represents a gate-drain voltage of transistors QN1 and QN2. The maximum value of the Vgdn is Vtn that is the gate-drain voltage of transistors QN1 and QN2 at the moment of pinch-off.

Thus, expression 3 is expressed as expression 4.

$$Vmax1 = Vdd - \Delta s1 + Vtn \qquad \text{<Expression 4>}$$

Generally, (Vdd−$\Delta$s1+Vtn) is greater than Vdd, the common mode input voltage range of the first differential amplifier 12 is between (Vss+$\Delta$c1+n+Vtn) and Vdd.

The input voltage range of the second differential amplifier 14 is between Vmin2 and Vmax2. Vmin2 is a minimum value of the input voltage of the second differential amplifier 14 and Vmax2 is a maximum value of the input voltage of the second differential amplifier 14.

$$Vmin2 = Vss + \Delta s2 + Vgdp \qquad \text{<Expression 5>}$$

$\Delta$s2 represents |Vds,sat| of two matched transistors QS7 and QS8. Vgdp represents a gate-drain voltage of transistors QP1 and QP2. Since the minimum value of Vgdp is −|Vtp|

(Vtp represents a threshold voltage of transistors QP1 and QP2), the expression 5 is expressed as expression 6.

$$Vimin2 = Vss + \Delta s2 - |Vtp| \qquad \text{<Expression 6>}$$

$$Vimax2 = Vdd - c2 + Vgsp \qquad \text{<Expression 7>},$$

wherein $\Delta c2$ represents |Vds,sat| of transistor QC2. Vgsp represents a gate-source voltage of transistors QP1 and QP2. Since Vgsp is the same as $(-\Delta p-|Vtp|)$, expression 7 is expressed as expression 8. $\Delta p$ represents |Vds,sat| of transistors QP1 and QP2.

$$Vimax2 = Vdd - \Delta c2 - \Delta p - |Vtp| \qquad \text{<Expression 8>}$$

Generally, $(Vss+\Delta s2-|Vtp|)$ is lower than Vss, the common mode input voltage range of the second differential amplifier 14 is between Vss and $(Vdd-\Delta c2-\Delta p-|Vtp|)$. The bias control voltage VS1 of transistor QC1 is $(Vss+Vtn+\Delta n)$ and the bias control voltage VS2 of transistor QC2 is $(Vdd-\Delta p-|Vtp|)$ so that the first and second differential amplifiers 12 and 14 satisfy the above expressions.

The differential input stage circuit 10 has three operation regions.

In a first operation mode, the input voltage range is between Vss and $(Vss+\Delta c1+\Delta n+Vtn)$, the transistors QN1 and QN2 of the first differential amplifier 12 are turned off, and the second differential amplifier 14 is turned on to operate in the saturation mode. Thus, when an output resistance of the differential input stage 10 is Ro in a small signal operation mode, low frequency differential mode voltage gain is Gmp (a transconductance of transistors QP1 and QP2)×Ro.

In a second operation mode, the input voltage range is between $(Vss+\Delta c1+\Delta n+Vtn)$ and $(Vdd-\Delta c2-\Delta p-|Vtp|)$, the first and second differential amplifiers 12 and 14 are turned on, and the transistors of the first and second differential amplifiers 12 and 14 operate in the saturation mode. Thus, when a transconductance of transistors QN1 and QN2 in the small signal operation mode, low frequency differential mode voltage gain is (Gmn+Gmp)×Ro.

In a third operation mode, the input voltage range is between $(Vdd-\Delta c2-\Delta p-|Vtp|)$ and Vdd, the first differential amplifier 12 are turned on, the transistors QN1 and QN2 operate in the saturation mode, and the second differential amplifier 14 is turned off. Thus, the low frequency differential mode voltage gain is Gmp×Ro.

The small signal voltage gain varies depending upon common mode input voltage, and the small signal voltage gain has non-linear characteristics. However, in case the operational amplifier is employed in a negative feedback circuit, the non-linear characteristic may be changed to linear characteristic when the small signal voltage gain is large enough throughout the whole common mode input voltage range.

Thus, the operational amplifier may operate throughout the whole common mode input voltage range (from Vss to Vdd).

The bias control circuit 30 is connected between the current mirror circuit 20 and the fourth current source 26. The bias control circuit 30 controls the gate bias voltage of the output stage circuit 40 based on external bias control signals VC1 and VC2. The gate bias voltage of the output stage circuit 40 determines the static bias current of the output stage circuit 40, and thus the static bias current of the output stage circuit 40 may be controlled by the external bias control signals VC1 and VC2.

The third current source 24 has current sink function. A bias current supplied from the positive supply rail voltage Vdd flows into transistors QS3 and QS6 via the transistor QS1 of the current mirror 22, and the third current source 24 sinks the current flowing along the signal path comprised of the transistors QC2 and QP2. The transistors QC1, QS7 and QS8 may be matched transistor pair and the gate electrodes of the transistors QC1, QS7 and QS8 are commonly connected to each other, thus the bias currents flowing through the first, third and fourth current sources 16, 24 and 26 are substantially the same.

The transistor QS8 of the fourth current source 26 sinks a bias current flowing through the bias control circuit 30. A bias current supplied from the positive supply rail voltage Vdd via the transistor QS2 is divided into two branch currents, the branch currents respectively flows into the first and second bias control circuit 32 and 34 to be mixed at the drain electrode of the transistor QS8, and the mixed currents flows into the negative supply rail voltage Vss via the transistor QS8.

For example, the transistors QS4 and QB4 are a matched transistor pair. The gate electrodes of the transistors QS4 and QB4 are commonly connected to each other. Thus, the bias current flowing through the transistor QS4 is substantially the same as the bias current flowing through the transistor QB4.

For example, the transistors QS5 and QB2 are a matched transistor pair. The gate electrodes of the transistors QS5 and QB2 are commonly connected to each other. Thus, the bias current flowing through the transistor QS5 is substantially the same as the bias current flowing through the transistor QB2.

Hereinafter, it is assumed that the transistors of the current summing circuit 20, the bias control circuit 30 and the output stage circuit 40 operate in the saturation region, and the body effect of the transistors is disregarded.

First, the gate voltage range of the output stage circuit 40 is between Vomin1 and Vomax1. Vomin1 is a minimum value of the gate voltage of the transistor QO1, and Vomax1 is a maximum value of the gate voltage of the transistor QO1.

$$Vomin1 = VC1 - Vgdb1 \qquad \text{<Expression 9>},$$

wherein Vgdb1 represents a gate-drain voltage of transistor QB1. Since the maximum value of Vgdb1 is Vtb1 (Vtb1 represents a threshold voltage of the transistor QB1), the expression 9 is expressed as expression 10.

$$Vomin1 = VC1 - Vtb1 \qquad \text{<Expression 10>}$$

The maximum value Vomax1 of the gate voltage of the transistor QO1 is expressed as expressions 11 and 12.

$$Vomax1 = VB2 - Vgds4 \qquad \text{<Expression 11>}$$

Vgds4 represents a gate-drain voltage of the transistor QS4. Since the minimum value of Vgds4 is $-|Vts4|$(Vts4 represents a threshold voltage of transistors QS4), the expression 11 is expressed as expression 12.

$$Vomax1 = VB2 + |Vts4| \qquad \text{Expression 12>}$$

Since the transistors of the first bias control circuit 32 operate in the saturation mode, VC1 is higher than $(Vss+\Delta s8+\Delta b2+\Delta b1+Vtb1)$, and VB2 is lower than $(Vdd-\Delta s2-\Delta s4-|Vts4|)$. $\Delta s8$ represents |Vds,sat| of transistor QS8, $\Delta b2$ represents |Vds,sat| of transistor QB2, and $\Delta b1$ |Vds,sat| of transistor QB1. $\Delta s2$ represents |Vds,sat| of transistor QS2, $\Delta s4$ represents |Vds,sat| of transistor QS4.

Thus, the gate voltage of the transistor QO1 is in a range between (VC1−Vtb1) and (VB2+|Vts4|).

The gate voltage range of the transistor QO2 of the output stage circuit 40 is between Vomin2 and Vomax2. Vomin2 is a minimum value of the gate voltage of the transistor QO2, and Vomax2 is a maximum value of the gate voltage of the transistor QO2.

$$Vomin2 = VB1 - Vgds5 \qquad \text{<Expression 13>}$$

Vgds5 represents the gate-drain voltage of the transistor QS5. Since the maximum value of the Vgds5 is Vts5 (Vts5 represents a threshold voltage of the transistor QS5), expression 13 is expressed as expression 14.

$$Vomin2 = VB1 - Vts5 \qquad \text{<Expression 14>}$$

$$Vomax2 = VC2 - Vgdb3 \qquad \text{<Expression 15>}$$

Vgdb3 represents the gate-drain voltage of the transistor QB3. Since the minimum value of the Vgdb3 is $-|Vtb3|$ (Vtb3 represents a threshold voltage of the transistor QB3), expression 15 is expressed as expression 16.

$$Vomax2 = VC2 + |Vtb3| \qquad \text{<Expression 16>}$$

Since the transistors of the second bias control circuit 34 operate in the saturation mode, VC2 is lower than (Vdd−Δs2−Δb4−Δb3−|Vtb3|), and VB1 is higher than (Vss−Δs8−Δs5−|Vts5|). Δs2 represents |Vds,sat| of transistor QS2, Δb4 represents |Vds,sat| of transistor QB4, and Δb3 represents |Vds,sat| of transistor QB3. Δs8 represents |Vds,sat| of transistor QS8, Δs5 represents |Vds,sat| of transistor QS5.

Thus, the gate voltage of the transistor QO2 is in a range between (VB1−Vts5) and (VC2+|Vtb3|).

The bias control circuit 30 controls the gate bias voltage of the output stage circuit 40 based on external bias control signals VB1 and VB2 and the gate-drain voltages of the transistors QB1, QB2, QB3 and QB4. The gate bias voltage of the output stage circuit 40 determines the bias current of the output stage circuit 40, and thus the bias current of the output stage circuit 40 may be controlled by the external bias control signals VB1 and VB2.

Figure 2A:
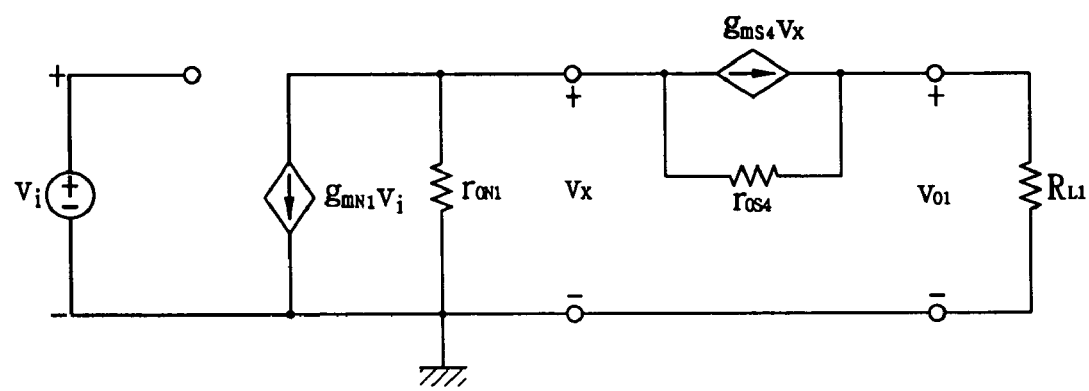
FIGS. 2A and 2B are small signal equivalent circuits modeling the transistors of the class AB rail-to-rail operational amplifier according to one exemplary embodiment of the present invention.
Figure 2B:
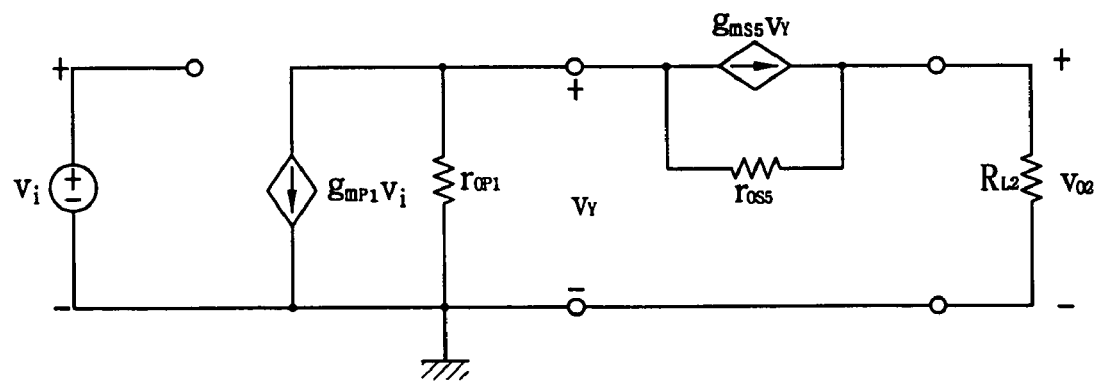

FIGS. 2A and 2B are small signal equivalent circuits modeling the transistors of the class AB rail-to-rail operational amplifier according to one exemplary embodiment of the present invention.

FIG. 2A is a small signal equivalent circuit modeling the transistors QN1 and QS4 that comprises a main signal path of the small signal applied to the POS terminal. In FIG. 2A, the small signal resistance of the transistors QS2 and QB4 is disregarded.

Referring to FIG. 2A, the transistors QN1 and QS4 operate in the saturation mode, when a small signal vi is applied to the gate electrode of the transistor QN1, a voltage controlled current source $g_{mN1} \times v_i$ is generated between the drain and source electrodes of the transistor QN1. A small signal resistance $r_{oN1}$ is connected between the drain and source electrodes of the transistor QN1. $g_{mN1}$ represents a transconductance of the transistor QN1. The transistor QS4 is folded cascode-connected to the transistor QN1. A voltage controlled current source $g_{mS4} \times vx$ is generated between the drain and source electrodes of the transistor QS4. The vx is a small signal output voltage of the transistor QN1 and a small signal input voltage of the transistor QS4. A small signal resistance $r_{oS4}$ is connected in parallel to the voltage controlled current source $g_{mS4} \times vx$. When an input resistor of the transistors connected to the drain electrode of the transistor QS4 is $R_{L1}$, a small signal voltage at both ends of the resistor $R_{L1}$ is $v_{o1}$.

A small signal voltage $v_{o1}$ that is input to the gate electrode of the transistor QO1 may be expressed by expression 17 that is approximated using the assumption in which $g_{mN1} \gg 1/r_{oN1}$ and $g_{mS4} \gg 1/r_{oS4}$.

$$v_{o1} = -g_{mN1} \times \{(r_{oN1} \times g_{mS4} \times r_{oS4}) \| R_{L1}\} \times v_i \qquad \text{<Expression 17>}$$

FIG. 2B is small signal equivalent circuit modeling the transistors QN1 and QS4 that comprises a main signal path of the small signal applied to the POS terminal.

In FIG. 2B, the small signal resistance of the transistors QS8 and QB2 is disregarded.

Referring to FIG. 2B, the transistors QP1 and QS5 operate in the saturation mode, when the small signal vi is applied to the gate electrode of the transistor QP1, a voltage controlled current source $g_{mp1} \times v_i$ is generated between the drain and source electrodes of the transistor QP1. A small signal resistor $r_{oP1}$ is connected between the drain and source electrodes of the transistor QP1. $g_{mP1}$ represents a transconductance of the transistor QP1. The transistor QS5 is folded cascode-connected to the transistor QP1. A voltage controlled current source $g_{mS5} \times vy$ is generated between the drain and source electrodes of the transistor QS5. The vy is a small signal output voltage of the transistor QP1 and a small signal input voltage of the transistor QS5. A small signal resistance $r_{oS5}$ is connected in parallel to the voltage controlled current source $g_{mS5} \times vy$. When an input resistor of the transistors connected to the drain electrode of the transistor QS5 is $R_{L2}$, a small signal voltage at both ends of the resistor $R_{L2}$ is $v_{o2}$.

A small signal voltage $v_{o2}$ that is input to the gate electrode of the transistor QO2 may be expressed by expression 18 that is approximated using the assumption in which $g_{mP1} \gg 1/r_{oP1}$ and $g_{mS5} \gg 1/r_{oS5}$.

$$v_{o2} = -g_{mP1} \times \{(r_{oP1} \times g_{mS5} \times r_{oS5}) \| R_{L2}\} \times v_i \qquad \text{<Expression 18>}$$

Figure 3:
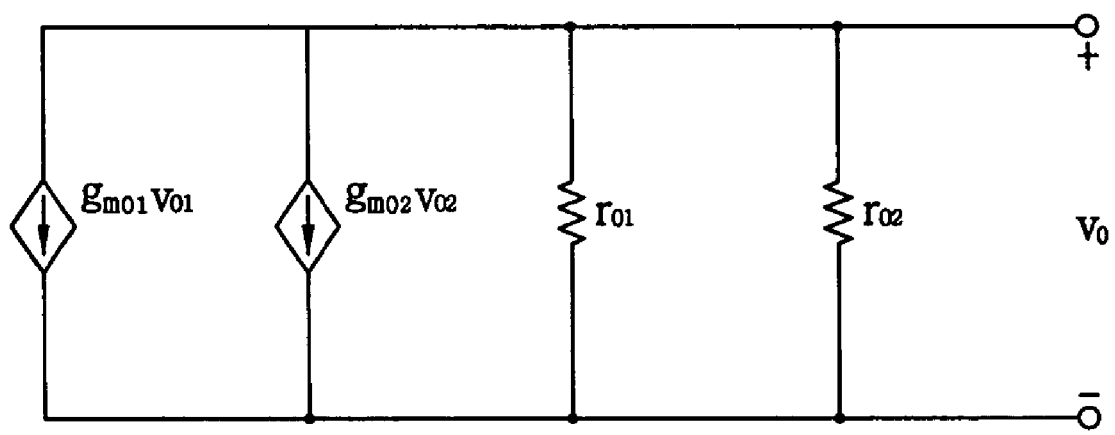
FIG. 3 is a small signal equivalent circuit modeling the transistors in an output stage circuit of the class AB rail-to-rail operational amplifier according to one exemplary embodiment of the present invention.

FIG. 3 is small signal equivalent circuit modeling the transistors in an output stage circuit of the class AB rail-to-rail operational amplifier according to one exemplary embodiment of the present invention.

Referring to FIG. 3, when the small signal $v_{o1}$ is applied to the gate electrode of the transistor QO1, a voltage controlled current source $g_{mO1} \times v_{o1}$ is generated between the drain and source electrodes of the transistor QO1. When the small signal $v_{o2}$ is applied to the gate electrode of the transistor QO2, a voltage controlled current source $g_{mO2} \times v_{o2}$ is generated between the drain and source electrodes of the transistor QO2. The voltage controlled current source $g_{mO2} \times v_{o2}$ is connected in parallel to the voltage controlled current source $g_{mO1} \times v_{o1}$. Small signal resistor $r_{o1}$ and $r_{o2}$ are connected in parallel to the voltage controlled current source $g_{mO1} \times v_{o1}$ and $g_{mO2} \times V_{o2}$.

$r_{o1}$ represents a small signal resistor of the transistor QO1, and $r_{o2}$ represents a small signal resistor of the transistor QO2.

A small signal output voltage $v_o$ of the operational amplifier is expressed by expression 19.

$$v_o = (g_{mO1} \times v_{o1} + g_{mO2} \times v_{o2}) \times (r_{o1} \| r_{o2}) \qquad \text{<Expression 19>}$$

As described above, the external bias control signals VB1 and VB2 control the static bias current of the output stage circuit 40, so that the class AB rail-to-rail operational amplifier may have a small operation current and a high small-signal gain.

The number of the transistors used in the bias control circuit 30 may be reduced, and thus the chip area occupied by the operational amplifier may be reduced.

<Embodiment 2>

Figure 4:
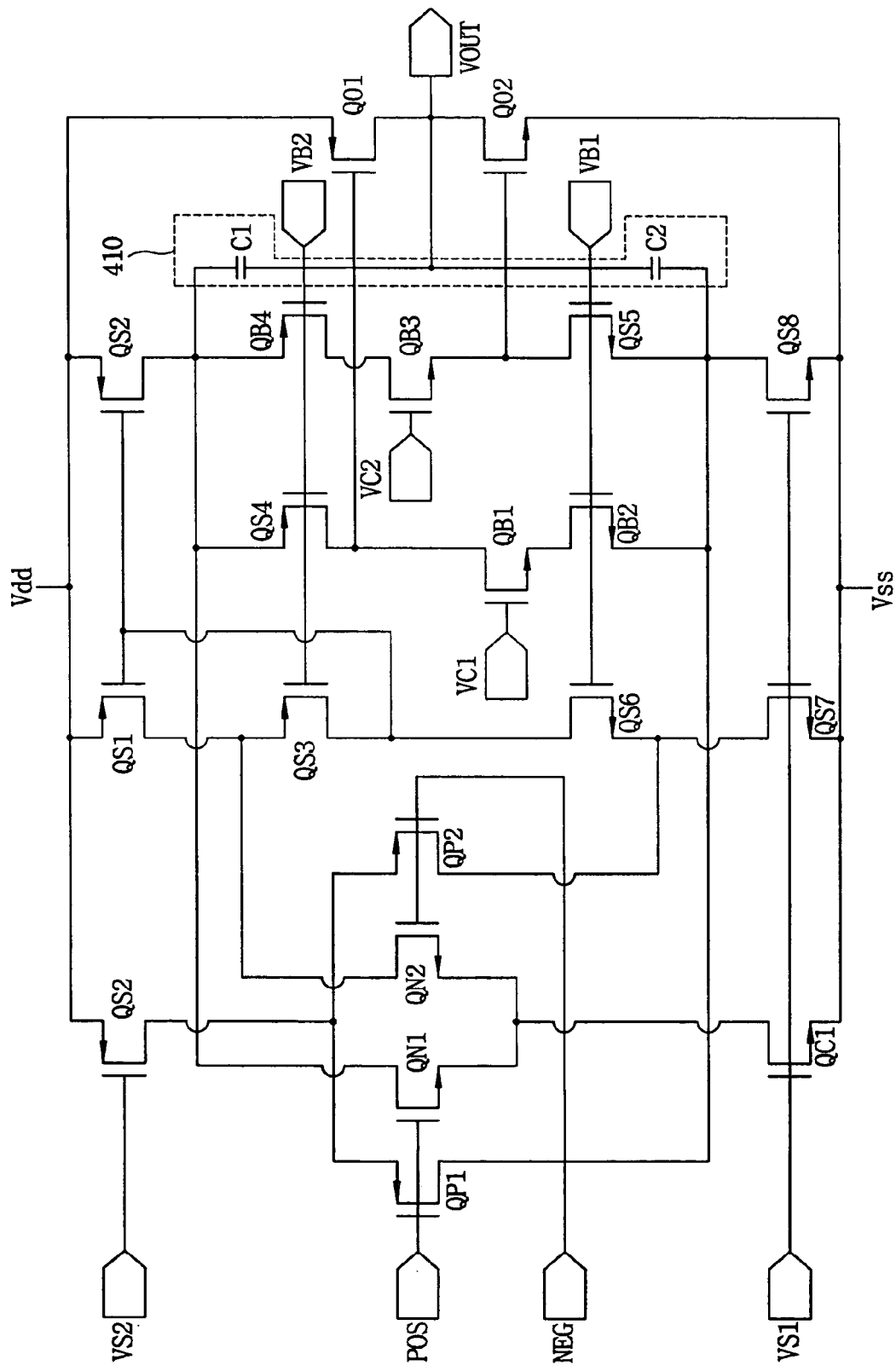
FIG. 4 is a circuit diagram showing a class AB rail-to-rail operational amplifier according to another exemplary embodiment of the present invention.

FIG. 4 is a circuit diagram showing a class AB rail-to-rail operational amplifier according to another exemplary embodiment of the present invention.

The elements of the circuit of FIG. 4 are the same as those of FIG. 1, with the exception of a frequency compensation circuit 410. Therefore, description of these like elements will not be repeated.

Referring to FIG. 4, the frequency compensation circuit 410 includes, for example, first capacitor C1 and second capacitor C2. The first capacitor C1 is connected between the drain electrode of the transistor QS2 of the current summing circuit 20 and the output terminal VOUT of the operational amplifier. The second capacitor C2 is connected between the drain electrode of the transistor QS8 of the current summing circuit 20 and the output terminal VOUT of the operational amplifier.

Since the operational amplifier usually is employed in a negative feedback circuit, it is required that the operational amplifier not oscillate operate in a stable fashion. Since a general operational amplifier employs a differential amplifier having a common source configuration as a input stage circuit, the general operational amplifier has an advantage of a high small-signal gain, however, the frequency characteristics of the general operational amplifier are worse. The operational amplifier according to exemplary embodiments of the present invention provides the folded cascode circuit in which the differential amplifiers (QN1 and QN2, QP1 and QP2) having the common source configuration are connected to the transistors QS3, QS4, QS5, QS6 having the common gate configuration.

The capacitors C1 and C2 enhance the high frequency characteristic of the operational amplifier. That is, the capacitors C1 and C2 enhance the phase margin in the high frequency region.

Figure 5A:
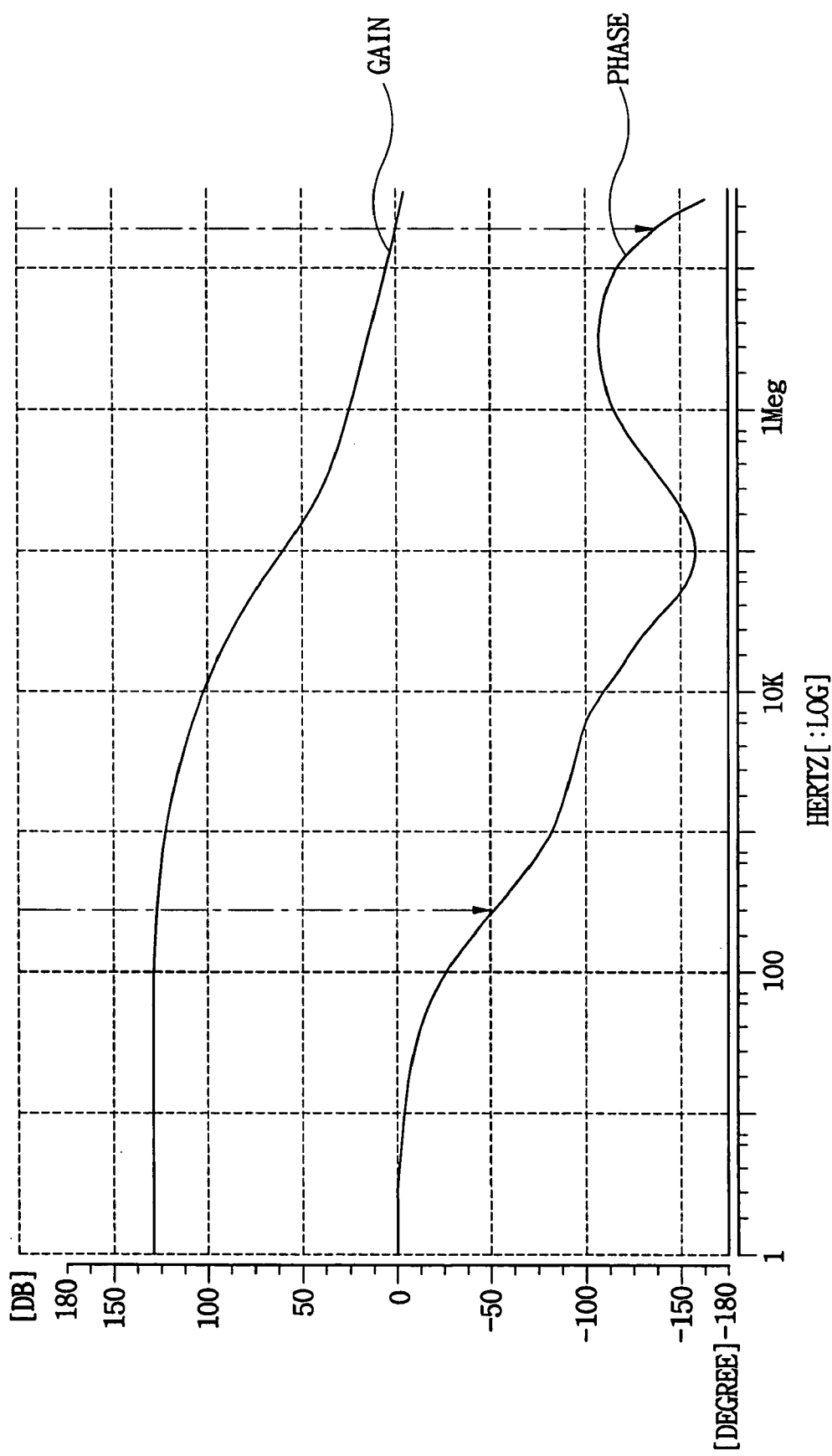
FIGS. 5A and 5B are bode plots showing phase margins of the class AB rail-to-rail operational amplifier of the present invention.
Figure 5B:
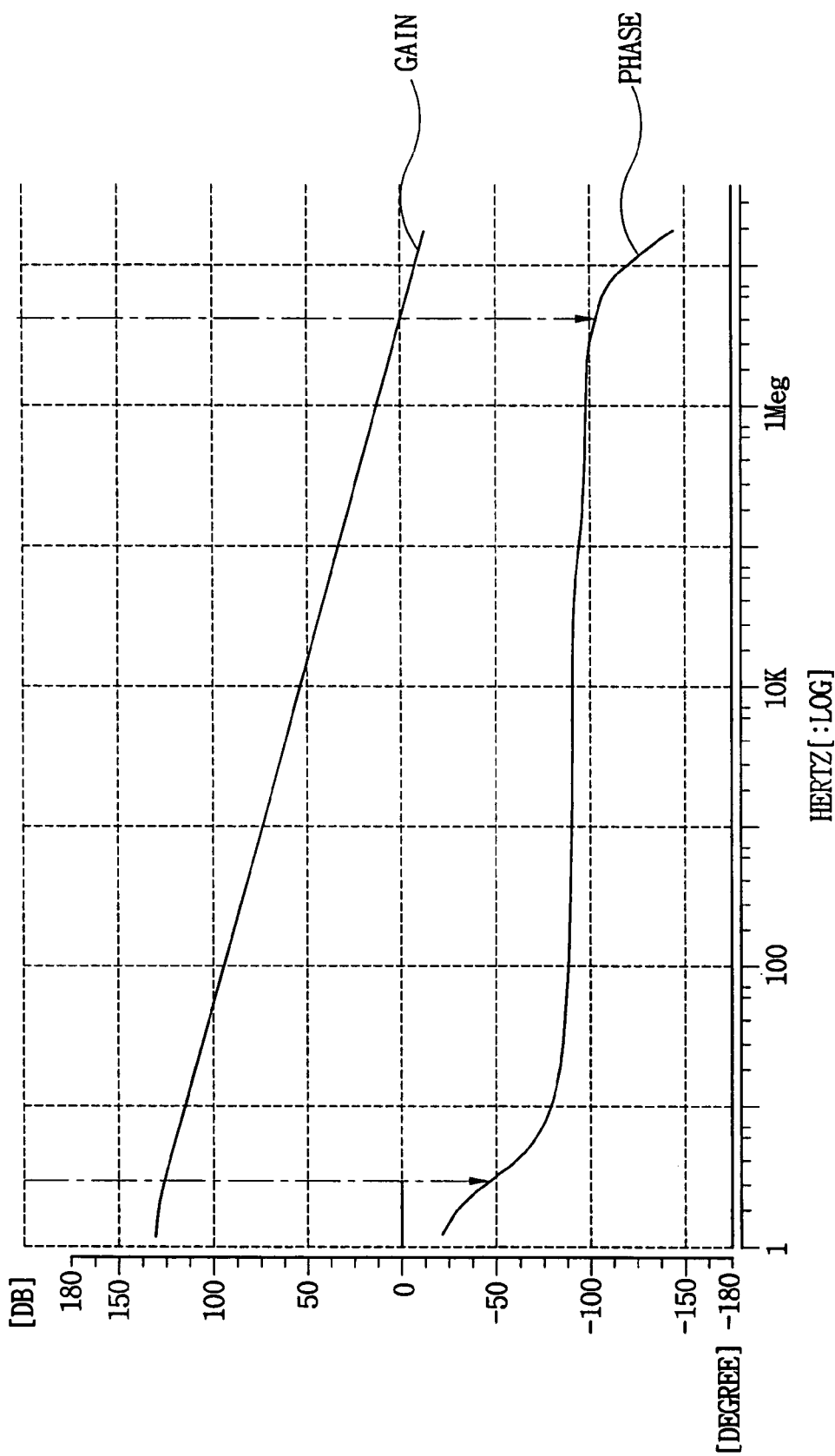

FIGS. 5A and 5B are bode plots showing phase margins of the class AB rail-to-rail operational amplifier of the present invention.

FIG. 5A is a bode plot showing the phase margin of the class AB rail-to-rail operational amplifier of FIG. 1 in which the capacitors C1 and C2 are not used.

Referring to FIG. 5A, the phase at the frequency when the gain is 1 (or 0 dB) is about −143° (degree). Thus, the phase margin is about 37° (i.e. 180°−143°).

FIG. 5B is a bode plot showing the phase margin of the class AB rail-to-rail operational amplifier of FIG. 4 in which the capacitors C1 and C2 are used.

Referring to FIG. 5B, the phase at the frequency when the gain is 1 (or 0 dB) is about −103° (degree). Thus, the phase margin is about 73° (i.e. 180°−103°). Thus, the phase margin was increased by about 36° when the frequency compensation capacitors C1 and C2 are used in the operational amplifier. The frequency characteristic of the operational amplifier may be enhanced by using the frequency compensation capacitors C1 and C.

According to above exemplary embodiments of the present invention, the static bias current of the output stage circuit of the class AB rail-to-rail operational amplifier is controlled by the external bias control signals. Thus, the class AB rail-to-rail operational amplifier provides a small operation current and high small-signal gain. In addition, the number of the transistors of the bias control circuit is reduced, and thus the chip area of the operational amplifier may be reduced.

In addition, the phase characteristics of the class AB rail-to-rail operational amplifier may be enhanced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A rail-to-rail operational amplifier comprising:
a differential input stage circuit including a first differential amplifier and a second differential amplifier, the first differential amplifier coupled to a negative supply rail voltage via a first current source, the second differential amplifier coupled to a positive supply rail voltage via a second current source;
a current summing circuit including a current mirror circuit, a third current source and a fourth current source, the current summing circuit being coupled between the positive and negative supply rail voltages and receiving an output signal of the differential input stage circuit;
an output stage circuit coupled to output terminals of the current summing circuit to output a differential amplified signal, the output stage circuit being coupled between the positive and negative supply rail voltages; and
a bias control circuit coupled to the output terminals of the current summing circuit and coupled between the current mirror circuit and the fourth current source, the bias control circuit receiving at least one bias control transistor bias voltage and at least one bias control transistor control voltage to control a bias voltage of input terminals of the output stage circuit, and to control a bias current of the output stage circuit;
wherein the bias control circuit includes a first bias control circuit and a second bias control circuit, the first bias control circuit being coupled in parallel to the second bias control circuit between the current mirror circuit and the fourth current source, the first bias control circuit including a first bias control transistor and a second bias control transistor, a control electrode of the first bias control transistor receiving a first bias control transistor bias voltage, and a control electrode of the second bias control transistor receiving a first bias control transistor control voltage.

2. The rail-to-rail operational amplifier of claim 1, wherein the first bias control circuit provides a first input terminal bias voltage to a first input terminal of the output stage circuit, the first input terminal bias voltage having a voltage level between about the first bias control transistor bias voltage and about the first bias control transistor control voltage.

3. The rail-to-rail operational amplifier of claim 1, wherein the second bias control circuit includes a third bias control transistor and a fourth bias control transistor, a control electrode of the third bias control transistor receiving a second bias control transistor bias voltage, and a control electrode of the fourth bias control transistor receiving a second bias control transistor control voltage.

4. The rail-to-rail operational amplifier of claim 3, wherein the second bias control circuit provides a second input terminal bias voltage to a second input terminal of the output stage circuit, the second input terminal bias voltage having a voltage level between about the second bias control transistor bias voltage and about the second bias control transistor control voltage.

5. The rail-to-rail operational amplifier of claim 1, wherein the current mirror circuit is coupled between the positive and negative supply rail voltages, and the fourth current source is coupled between the negative supply rail voltage and the bias control circuit.

6. The rail-to-rail operational amplifier of claim 5, wherein the current mirror includes a first common-gate amplifier cascode-connected to the first differential amplifier, the first common-gate amplifier outputs a first amplified signal corresponding to an input signal of the first differential amplifier.

7. The rail-to-rail operational amplifier of claim 6, wherein the current summing circuit further includes a second common-gate amplifier cascode-connected to the second differential amplifier, the second common-gate amplifier outputs a second amplified signal corresponding to an input signal of the second differential amplifier.

8. The rail-to-rail operational amplifier of claim 7, wherein the output stage circuit includes:
a first transistor, coupled to an output terminal of the first common-gate amplifier, for receiving the first amplified signal to output the differential amplified signal; and
a second transistor, coupled to an output terminal of the second common-gate amplifier, for receiving the second amplified signal to output the differential amplified signal.

9. The rail-to-rail operational amplifier of claim 8, wherein the first transistor is coupled between the positive supply rail voltage and an output terminal of the output stage circuit, the second transistor is coupled between the negative supply rail voltage and the output terminal of the output stage circuit, the first and second transistor has a common source configuration, and first current electrodes of the first and second transistors are coupled to the output terminal of the output stage circuit.

10. The rail-to-rail operational amplifier of claim 1, wherein the rail-to-rail operational amplifier is class AB rail-to-rail operational amplifier.

11. The rail-to-rail operational amplifier of claim 1, further including: a frequency compensation circuit that is configured to compensate a frequency characteristic of an output signal of the output stage circuit, the frequency compensation circuit coupled between an output terminal of the differential input stage circuit and an output terminal of the output stage circuit.

12. The rail-to-rail operational amplifier of claim 11, wherein the frequency compensation circuit includes a first capacitor and a second capacitor, the first capacitor being coupled between an output terminal of the first differential amplifier and the output terminal of the output stage circuit, and the second capacitor being coupled between an output terminal of the second differential amplifier and the output terminal of the output stage circuit.

13. A rail-to-rail operational amplifier comprising:
a differential input stage circuit including a first differential amplifier and a second differential amplifier, the first differential amplifier coupled to a negative supply rail voltage via a first current source, the second differential amplifier coupled to a positive supply rail voltage via a second current source;
a current summing circuit including a current mirror circuit, a third current source and a fourth current source, the current summing circuit being coupled between the positive and negative supply rail voltages and receiving an output signal of the differential input stage circuit;
an output stage circuit coupled to output terminals of the current summing circuit to output a differential amplified signal, the output stage circuit being coupled between the positive and negative supply rail voltages; and
a bias control circuit coupled to the output terminals of the current summing circuit and coupled between the current mirror circuit and the fourth current source, the bias control circuit receiving at least one bias control transistor bias voltage and at least one external bias control transistor control voltage to control a bias voltage of input terminals of the output stage circuit, and to control a bias current of the output stage circuit;
wherein the current mirror circuit is coupled between the positive and negative supply rail voltages, and the fourth current source is coupled between the negative supply rail voltage and the bias control circuit, and wherein the current mirror circuit includes a first common-gate amplifier cascode-connected to the first differential amplifier, the first common-gate amplifier outputs a first amplified signal corresponding to an input signal of the first differential amplifier,
wherein the current summing circuit includes a second common-gate amplifier cascode-connected to the second differential amplifier, the second common-gate amplifier outputs a second amplified signal corresponding to an input signal of the second differential amplifier, and
wherein the output stage circuit includes:
a first transistor, coupled to an output terminal of the first common-gate amplifier, for receiving the first amplified signal to output the differential amplified signal; and
a second transistor, coupled to an output terminal of the second common-gate amplifier, for receiving the second amplified signal to output the differential amplified signal.

14. The rail-to-rail operational amplifier of claim 13, wherein the first transistor is coupled between the positive supply rail voltage and an output terminal of the output stage circuit, the second transistor is coupled between the negative supply rail voltage and the output terminal of the output stage circuit, the first and second transistor has a common source configuration, and first current electrodes of the first and second transistors are coupled to the output terminal of the output stage circuit.

* * * * *